US009826628B2

(12) United States Patent
Yang et al.

(10) Patent No.: US 9,826,628 B2
(45) Date of Patent: Nov. 21, 2017

(54) FLEXIBLE ELECTRONIC MODULE

(71) Applicant: Industrial Technology Research Institute, Hsinchu (TW)

(72) Inventors: Ming-Huan Yang, Taichung (TW); Wei-Ting Chen, Taoyuan (TW); Chih-Chia Chang, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/649,031

(22) Filed: Jul. 13, 2017

(65) Prior Publication Data

US 2017/0311437 A1 Oct. 26, 2017

Related U.S. Application Data

(62) Division of application No. 14/250,004, filed on Apr. 10, 2014, now Pat. No. 9,736,930.

(30) Foreign Application Priority Data

Dec. 26, 2013 (TW) ............................ 102148380 A

(51) Int. Cl.
*H05K 1/00* (2006.01)
*H05K 1/02* (2006.01)
*H05K 1/18* (2006.01)

(52) U.S. Cl.
CPC ............ *H05K 1/028* (2013.01); *H05K 1/181* (2013.01); *H05K 2201/09036* (2013.01)

(58) Field of Classification Search
CPC .................. H05K 1/028; H05K 1/181; H05K 2201/09036
See application file for complete search history.

(56) References Cited

U.S. PATENT DOCUMENTS 2,143,649 A 1/1939 Dansard
5,742,484 A 4/1998 Gillette et al.
8,207,473 B2 6/2012 Axisa et al.
(Continued)

FOREIGN PATENT DOCUMENTS

JP 2007-258219 A 10/2007
TW 201129342 A1 9/2011

OTHER PUBLICATIONS

Cheng et al., "The development of a highly twistable tactile sensing array with stretchable helical electrodes", Sensors and Actuators A 166 (2011) 226-233.

(Continued)

*Primary Examiner* — Yuriy Semenenko
(74) *Attorney, Agent, or Firm* — Birch, Stewart, Kolasch & Birch, LLP

(57) ABSTRACT

A flexible electronic module is provided, including a flexible substrate having a supporting portion, a body portion, and a connection portion, wherein the supporting portion is connected with the body portion via the connection portion; a first trench formed between the supporting portion and the body portion; an electronic component disposed over a portion of the supporting portion; and a conductive line disposed over the supporting portion, the connection portion, and the body portion for connecting the electronic component.

10 Claims, 7 Drawing Sheets

(56) References Cited

U.S. PATENT DOCUMENTS 8,243,461 B2 * 8/2012 Uchida ............... B29C 45/1418 361/760
8,519,950 B2 8/2013 Radivojevic et al.
9,172,352 B2 * 10/2015 Rogers ................... H03H 9/462
9,513,666 B2 * 12/2016 Li ........................ H01Q 9/0407
9,640,456 B2 * 5/2017 Chien ................. H01L 23/3121
2001/0001550 A1 5/2001 Bryzek et al.
2006/0110580 A1 5/2006 Aylward et al.
2008/0130241 A1 * 6/2008 Nagar ................... H01L 21/563 361/719
2008/0157235 A1 7/2008 Rogers et al.
2008/0205023 A1 * 8/2008 Khanna ................ H05K 1/0271 361/811
2010/0143848 A1 6/2010 Jain et al.
2010/0224950 A1 9/2010 Dinyari et al.
2010/0244246 A1 9/2010 Caplet
2010/0271191 A1 10/2010 de Graff et al.
2010/0330338 A1 12/2010 Boyce et al.
2012/0051005 A1 3/2012 Vanfleteren et al.
2012/0165759 A1 6/2012 Rogers et al.
2012/0279762 A1 11/2012 Hur et al.
2012/0327608 A1 12/2012 Rogers et al.
2013/0087865 A1 * 4/2013 Ten Have ........... B81C 1/00158 257/419
2014/0144480 A1 5/2014 Lee
2014/0353772 A1 * 12/2014 Stermer, Jr. ......... B81C 1/00325 257/415
2015/0077949 A1 * 3/2015 Baek ...................... H05K 3/323 361/749
2015/0102317 A1 4/2015 Kim

OTHER PUBLICATIONS

Kim et al., "A Biaxial Stretchable Interconnect With Liquid-Alloy-Covered Joints on Elastomeric Substrate", Journal of Microelectromechanical Systems, Vol. 18, No. 1, Feb. 2009, 138-146.
Kim et al., "Flexible and Stretchable Electronics for Biointegrated Devices", Annual Review of Biomedical Engineering, vol. 14: 113-128 (Volume publication date Aug. 2012).
Kim et al., "Materials for stretchable electronics in bioinspired and biointegrated devices", MRS Bulletin, vol. 37, Mar. 2012, 226-235.
Lipomi et al., "Skin-like pressure and strain sensors based on transparent elastic films of carbon nanotubes", Nature Nanotechnology, vol. 6, Dec. 2011, 788-792.
Lipomi et al., "Stretchable, elastic materials and devices for solar energy conversion", Energy & Environmental Science, 2011, 4, 3314-3328.
TW Office Action dated Mar. 6, 2015. pp. 1-8.

* cited by examiner

FLEXIBLE ELECTRONIC MODULE

CROSS REFERENCE TO RELATED APPLICATION

This application is a Divisional of pending U.S. patent application Ser. No. 14/250,004, filed Apr. 10, 2014 and entitled "FLEXIBLE ELECTRONIC MODULE".

TECHNICAL FIELD

The disclosure relates to electronic devices. Particularly, the disclosure relates to a flexible electronic module with improved reliability and a longer lifespan.

BACKGROUND

Flexible electronic devices have been widely adopted in various applications such as biological experiments, medical treatments, and consumer electronic devices. Common flexible electronic devices are, for example, flexible display devices, skin-like electronic sensors, and stretchable/deformable neural interface systems.

However, a sensing electronic device in the flexible electronic devices, such as a sensing chip, is usually composed of inflexible materials such as semiconductor materials. Therefore, as the number of uses or the operation frequency increases, the inflexible electronic devices made of inflexible materials may thus show some undesired problems such as peeling or delamination of the sensing electronic device. As a result, the reliability and the lifetime of the flexible electronic device may be thus affected.

SUMMARY

An exemplary flexible electronic module is provided, comprising a flexible substrate, a first trench, an electronic device, and a conductive line. The flexible substrate comprises a supporting portion, a body portion, and a connection portion. The supporting portion is connected to the body portion through the connection portion. The first trench is formed between the supporting portion and the body portion. The electronic device is disposed over a portion of the supporting portion. The conductive line is disposed over the supporting portion, the connection portion, and the body portion for connecting the electronic device.

Another exemplary flexible electronic module is provided, comprising a flexible substrate, a first trench, an electronic device, and a conductive line. The flexible substrate comprises a supporting portion, a body portion, a connection portion, and a line-routing portion. A surface of the body portion is lower than surfaces of the supporting portion, the connection portion, and the line-routing portion. The supporting portion is connected to the line-routing portion through the connection portion. The first trench is disposed between the supporting portion, the connection portion, and the line-routing portion. The electronic device is disposed over the supporting portion. The conductive line is disposed over the supporting portion, the connection portion, and the line-routing portion for connecting the electronic device.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION

Figure 1:
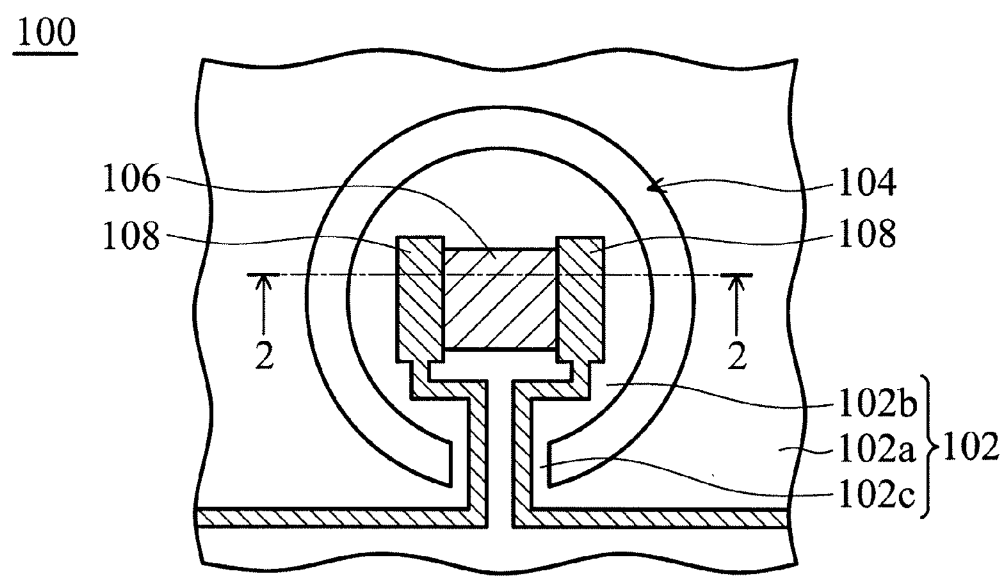
FIG. 1 is a schematic top view showing a flexible electronic device according to an embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
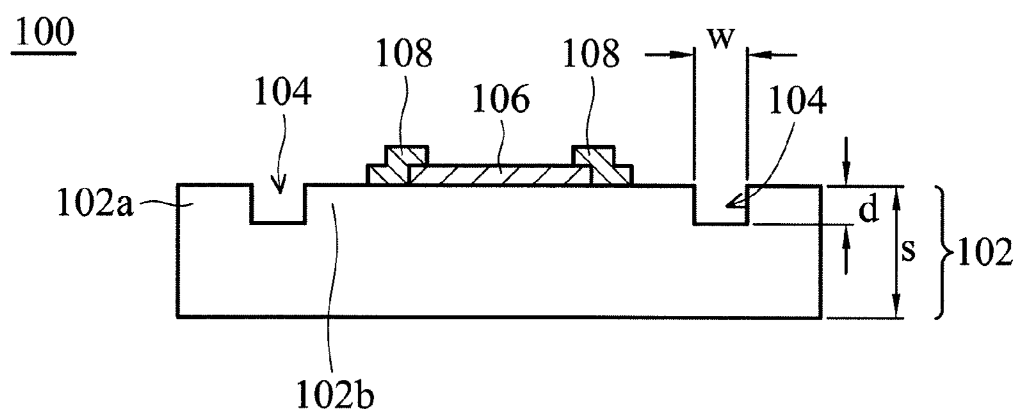
FIG. 2 is a schematic cross-sectional view showing a portion of the flexible electronic device in FIG. 1 along line 2-2 therein.

FIG. 1 and FIG. 2 are schematic top and cross-sectional views showing an exemplary flexible electronic module 100, respectively. The schematic cross-sectional view in FIG. 2 shows a cross-sectional structure of a portion of the flexible electronic module 100 along line 2-2 in FIG. 1.

As shown in FIGS. 1-2, the flexible electronic module 100 comprises a flexible substrate 102, a trench 104, an electronic device 106, and a pair of conductive lines 108. The trench 104 is formed on a portion of the flexible substrate 102 to thereby define a body portion **102*a* and a supporting portion 102*b* separated by the trench 104. The supporting portion 102*b* is connected with the body portion 102*a* through a connection portion 102*c*. In one embodiment, a surface of the body portion 102*a* is coplanar with a surface of the supporting portion 102*b*. The trench 104 can be formed by combination of a lithography process and an etching process, or a laser cutting process (both not shown). In one embodiment, the flexible substrate 102 may comprise flexible or stretchable insulating materials such as rubber, polyurethanes, polysiloxane, polyolefin, or polychlorinated olefins. The conductive lines 108 may comprise conductive materials such as conductive polymers, amorphous metal alloys, graphene, or nano conductive lines. The conductive lines 108** may comprise flexible or inflexible conductive materials. Characteristics of the flexible conductive materials can be referred to in the thesis entitled "Compliant Silver Nanowire-Polymer Composite Electrodes for Bistable Large Strain Actuation", Advanced Materials, vol. 24, pages 1321-1327 (2012), or the thesis entitled "Buckling of Aligned Carbon Nanotubes as Stretchable Conductors: A New Manufacturing Strategy", Advanced Materials, vol. 24, issue 8, pages 1073-1077 (2012).

As shown in FIG. 1, the body portion 102*a* surrounds the supporting portion 102*b*, and an electronic device 106 is disposed over a portion of the supporting portion 102*b*. In one embodiment, the electronic device 106 can be a sensing device such as a thermal-sensing device, a stress-sensing device, a light-sensing device, a humidity-sensing device, or a gas-sensing device, and may comprise inflexible materials such as semiconductor silicon therein. Alternatively, the electronic device 106 can be a sensing device such as a light-emitting device, a thermo-electrical device, or an electromagnetic device, and may comprise inflexible materials such as oxide or metal materials. In addition, a pair of conductive lines 108 are respectively disposed over different positions of the supporting portion 102*b* to connect different portions, for example a positive end and a negative end (both not shown) of the electronic device 106. Moreover, the conductive lines 108 are disposed over a portion of the connection portion 102*c* and the body portion 102*a*, respectively, to form electrical connections between the electronic device 106 and outer electronic devices or conductive lines (both not shown). In other embodiments, the conductive line 108 may be formed in other numbers, for example one or two conductive lines 108, and is not limited to the pair of conductive lines 108 shown in FIG. 1.

Figure 3:
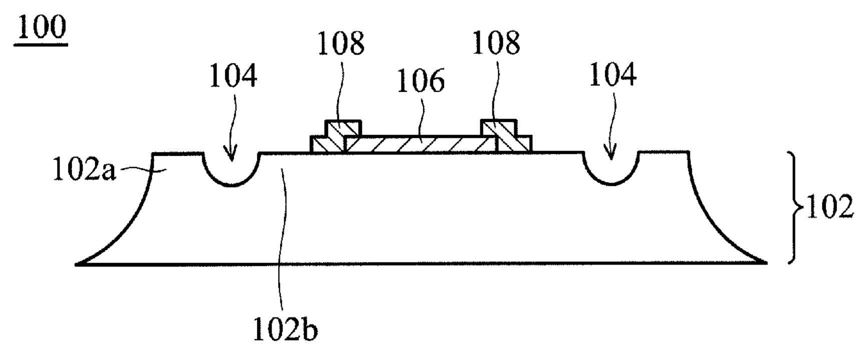
FIG. 3 is a schematic cross-sectional view showing a flexible electronic device in FIG. 2 being stretched by stress.

In FIG. 2, the trench 104 is formed with a depth d, and a ratio of the depth d to a thickness S of the flexible substrate 102 is between about 1:2 and 1:10. The trench 104 surrounds about 90-99% of a circumference of the supporting portion 102*b* to separate the body portion 102*a* with the supporting portion 102*b* of the flexible substrate 102. Therefore, as shown in FIG. 3, while external stress (not shown) is applied to the flexible electronic module 100 to induce tensile deformation thereto, the supporting portion 102*b* may show an amount of tensile strain that is less than about 10%, may less than 5%, while the body portion 102*a* shows an amount of tensile strain that is about 20% to 60%. The amount of the tensile strain mentioned above is defined as [(a size of the portion prior to deformation−a size of the portion after deformation)/a size of the portion prior to deformation] *100%.

Therefore, while the external stress is applied to the flexible substrate 102 shown in FIGS. 1-3, the supporting portion 102*b* can be taken as a region with lower tensile deformation when compared with the body portion 102*a* of the flexible substrate 102, such that the electronic device 106 disposed over the supporting portion 102*b* is less affected by the tensile deformation induced by the external stress, thereby reducing undesired peeling or delaminating of the overlying electronic device 106 which may be caused by the stretched deformation of the supporting portion 102*b*, and improving the reliability and lifetime of the electronic device 106.

Figure 4:
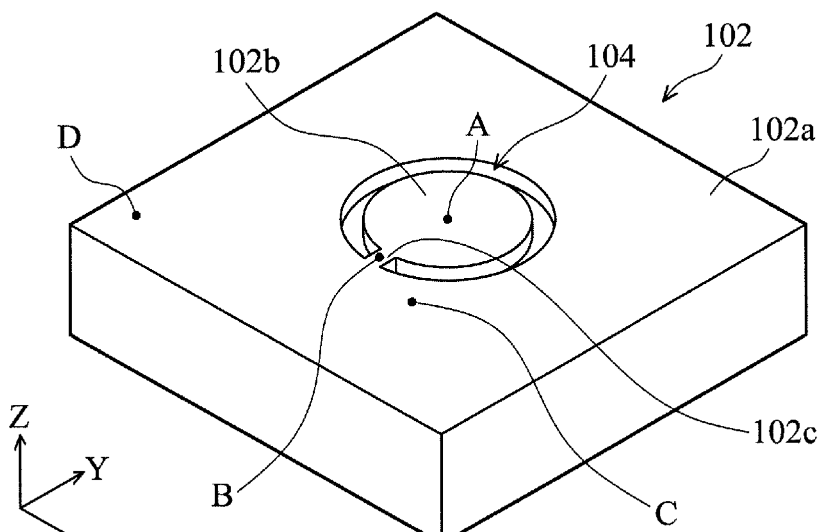
FIG. 4 is a schematic perspective view showing a flexible substrate applicable in a flexible electronic module according to an embodiment of the disclosure.

FIG. 4 is a schematic perspective view showing a flexible substrate 102 applicable in the flexible electronic module 100 shown in FIGS. 1-3. As shown in FIG. 4, the portion of the flexible substrate 102 is a portion adjacent to the body portion 102*a* and comprises the body portion 102*a*, the supporting portion 102*b*, the connection portion 102*c*, and the trench 104. The configuration of this portion is similar with that shown in FIGS. 1-3 and is not described here again for brevity.

In addition, the shapes of the supporting portion 102*b* and the trench 104 in the flexible substrate 12 applicable in the flexible electronic module 100 shown in FIGS. 1-4 are not limited to the circular shape shown in FIGS. 1 and 4. In other embodiments, the shapes of the supporting portion 102*b* and the trench 104 in the flexible substrate 102 can be, for example, other shapes including oval, and polygonal such as rectangular or hexagonal.

Figure 5:
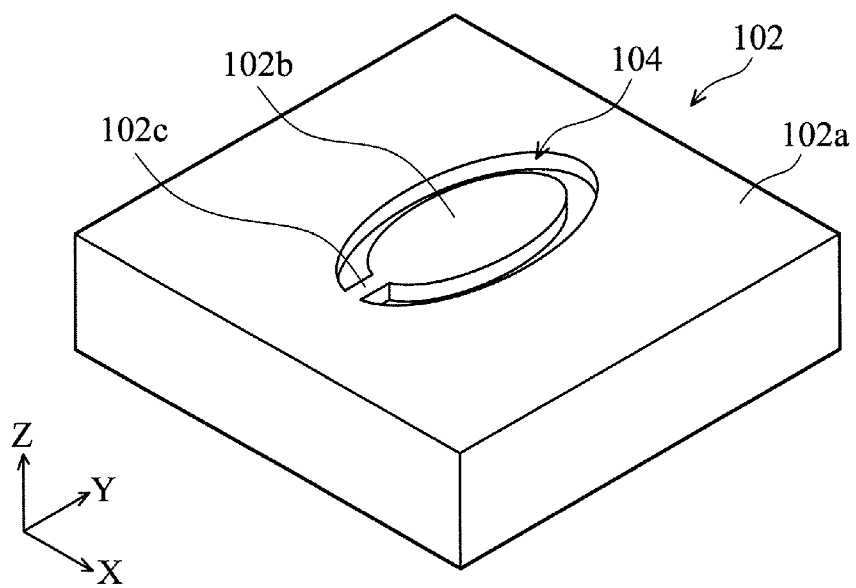
FIG. 5 is a schematic perspective view showing a flexible substrate applicable in a flexible electronic module according another embodiment of the disclosure.
Figure 6:
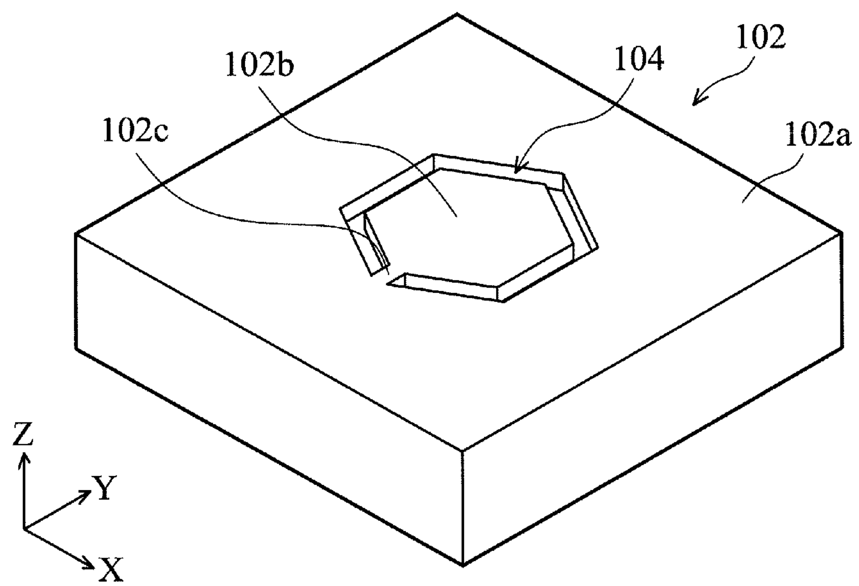
FIG. 6 is a schematic perspective view showing a flexible substrate applicable in a flexible electronic module according to yet another embodiment of the disclosure.
Figure 7:
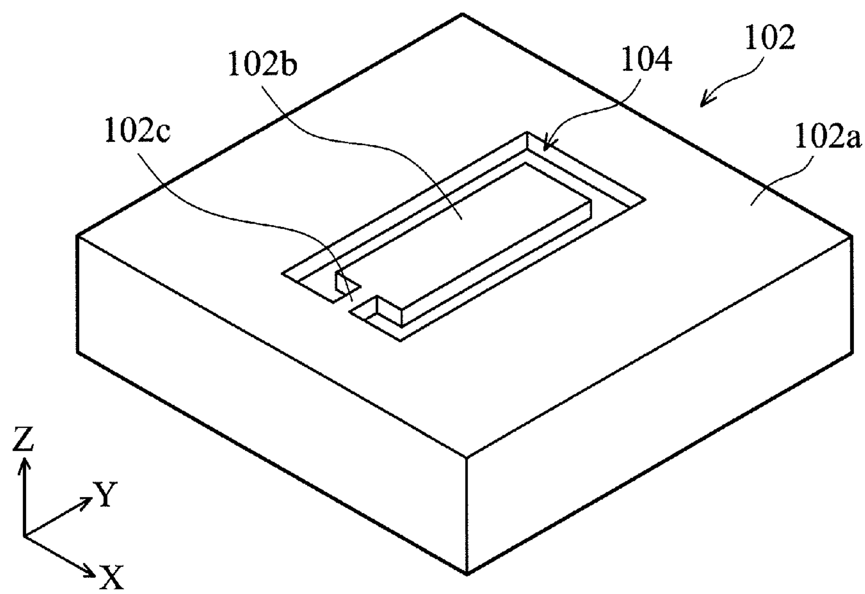
FIG. 7 is a schematic perspective view showing a flexible substrate applicable in a flexible electronic module according to another embodiment of the disclosure.

FIG. 5 is a schematic perspective view showing another exemplary flexible substrate 102 applicable in the flexible electronic module 100 shown in FIGS. 1-3, comprising the supporting portion 102*b* and the trench 104 having an oval shape. In addition, FIG. 6 is a schematic perspective view showing yet another exemplary flexible substrate 102 applicable in the flexible electronic module 100 shown in FIGS. 1-3, comprising the supporting portion 102*b* and the trench 104 having a hexagonal shape. Moreover, FIG. 7 is a schematic perspective view showing another exemplary flexible substrate 102 applicable in the flexible electronic module 100 shown in FIGS. 1-3, comprising the supporting portion 102*b* and the trench 104 having a rectangular configuration.

Figure 8:
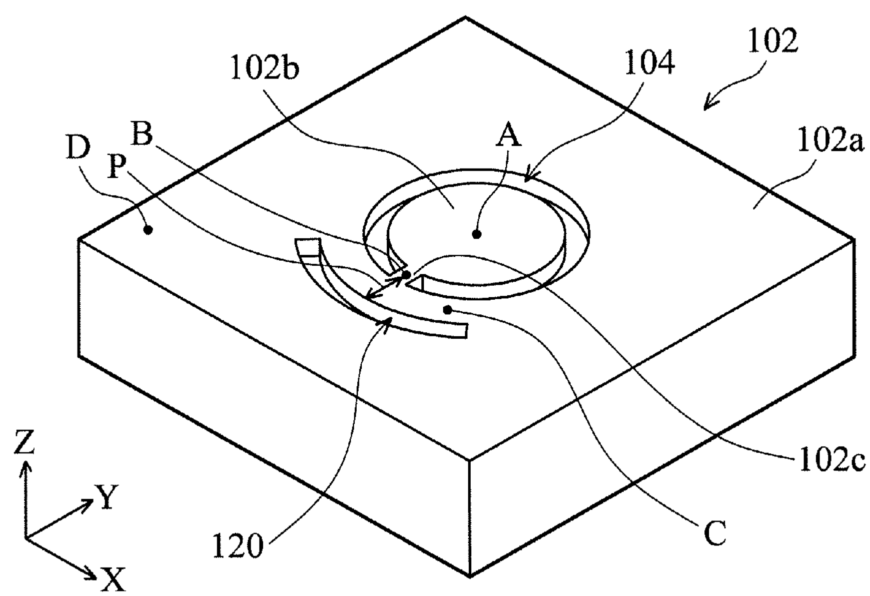
FIG. 8 is a schematic perspective view showing a flexible substrate applicable in a flexible electronic module according to yet another embodiment of the disclosure.

FIG. 8 is a schematic perspective view showing yet another flexible substrate 102 applicable in the flexible electronic module 100 shown in FIGS. 1-3. In one embodiment, the flexible substrate 102 shown in FIG. 8 is similar to that shown in FIG. 4, and the difference therebetween is that a trench 120 is additionally disposed in the flexible substrate 102. The trench 120 is disposed in a portion of the body portion 102*a* at a side adjacent to the connection portion 102*c*, having a distance P to the connection portion 102*c* The distance P can be adjusted according to the needs of the design but is not a fixed distance. A ratio of a depth (not shown) of the trench 120 to a thickness (not shown) of the flexible substrate (not shown) is between about 1:2 and 1:10. Due to the formation of the trench 120, while external stress (not shown) is applied to the flexible substrate 102 and causes tensile strain thereto, the tensile strain at the supporting portion 102*b* can be further reduced and maintains an amount of tensile strain less than 10%. The amount of tensile strain mentioned above is defined as [(a size of a portion prior to deformation−a size of a portion after deformation)/a size of a portion prior to deformation]*100%. In addition, the trench 120 may have a shape similar to the shape of an edge of the supporting portion 102*b* from a top view. Since the supporting portion 102*b* is formed with a circular configuration, such that the trench 120 may have a curved configuration. However, in other embodiments, for example the embodiments shown in FIGS. 5-7, the trench 120 can also be additionally formed, and the shape of the trench 120 is not limited to the shape shown in FIG. 8 and may have a configuration similar with a shape of an edge of the supporting portion shown in FIGS. 5-7.

Figure 9:
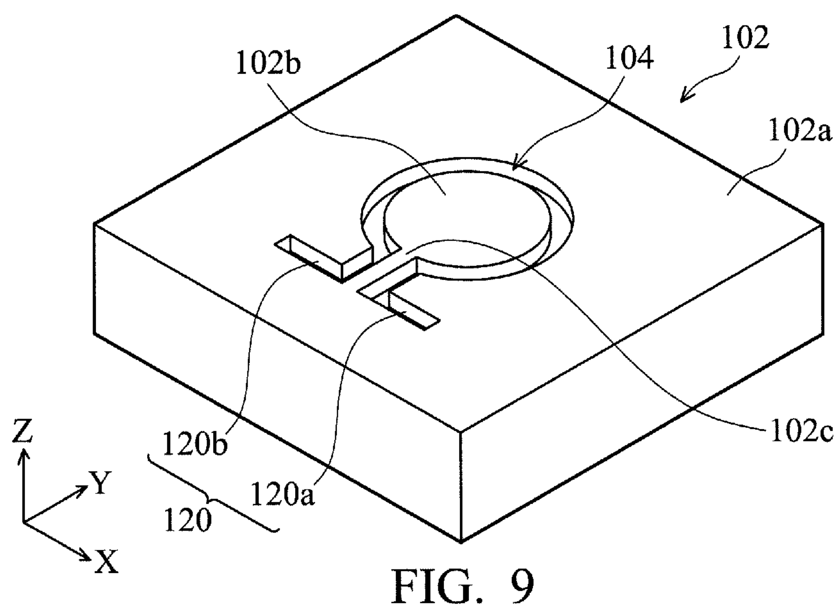
FIG. 9 is a schematic perspective view showing a flexible substrate applicable in a flexible electronic module according to another embodiment of the disclosure.

FIG. 9 is a schematic perspective view showing another exemplary flexible substrate 102 applicable in the flexible electronic module 100 shown in FIGS. 1-3. The exemplary flexible substrate 102 in FIG. 9 is similar with that shown in FIG. 8, and a difference therebetween is the trench 120 shown in FIG. 9 is disposed at a place adjacent to the connection portion 102*c* and the trench 120 is composed of an L-shape trench 120*a* and an inverted L-shaped trench 102*b* connected to an end of trench 104, respectively. Therefore, while external stress (not shown) is applied to the flexible substrate 102 and causes tensile strain thereto, the tensile strain at the supporting portion 102*b* can be further reduced. The trench 120 in the embodiment has an CI configuration from a top view.

Figure 10:
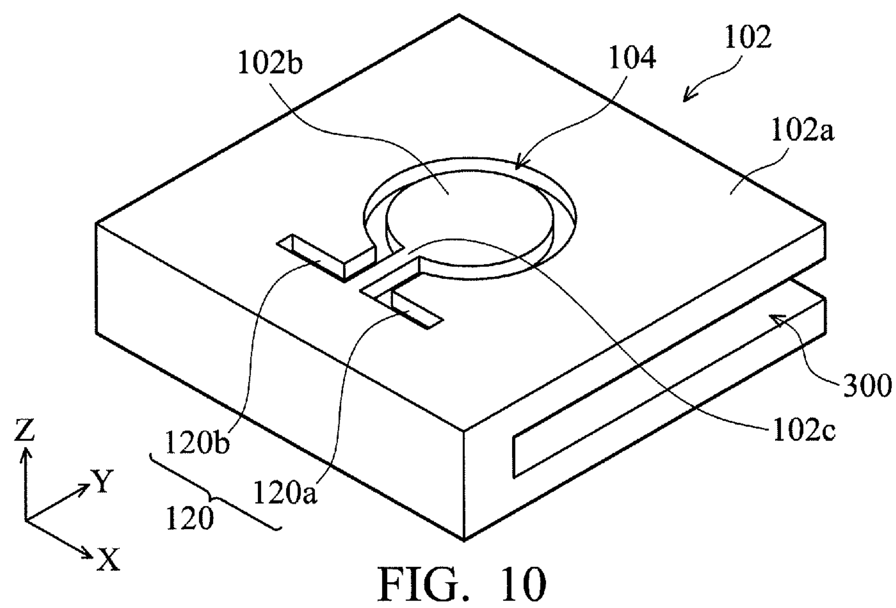
FIG. 10 is a schematic perspective view showing a flexible substrate applicable in a flexible electronic module according to yet another embodiment of the disclosure.

FIG. 10 is a schematic perspective view showing yet another flexible substrate 102 applicable in the flexible electronic module 100 shown in FIGS. 1-3. The exemplary flexible substrate 102 in FIG. 10 is similar with that in FIG. 10 and further comprises a recess 300 formed in a portion of the body portion 102*a*, such that while an external stress (not shown) is applied to the flexible substrate 102 and causes tensile strain thereto, the tensile strain at the supporting portion 102*b* can be further reduced. As shown in FIG. 10, the recess 300 extends beneath the supporting portion 102*b*, the connection portion 102*c*, and the trenches 104 and 120, thereby suspending the supporting portion 102*b*, the connection portion 102*c*, and the trenches 104.

Figure 11:
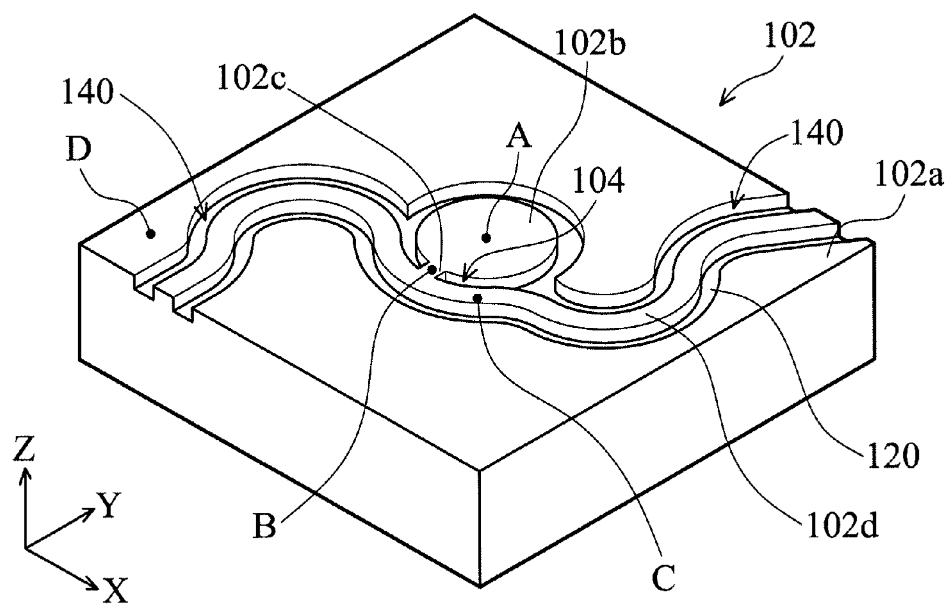
FIG. 11 is a schematic perspective view showing a flexible substrate applicable in a flexible electronic module according to another embodiment of the disclosure.

FIG. 11 is a schematic perspective view showing another flexible substrate 102 applicable in the flexible electronic module 100 shown in FIGS. 1-3. The exemplary flexible substrate 102 in FIG. 11 is similar with that shown in FIG. 8, and a trench 140 is further formed at a place adjacent to two ends of the trench 104 adjacent to the connection portion 102*c*, respectively. At this time, the trenches 140 are disposed near two ends of the trench 104 adjacent to the connection portion 102*c*, respectively, and the trench 120 is disposed in the body portion 102*a* and extends in parallel with the two trenches 140 and the portion of the trench 104 connected therewith, thereby defining a line-routing portion 102*d* in the body portion 102. As shown in FIG. 11, surfaces of the body portion 102*a*, the supporting portion 102*b*, the connection portion 102*c*, and the line-routing portion 102*d* may be a coplanar, and the connection portion 102*c* is connected with a portion of the supporting portion 102*b* and a portion of the line-routing portion 102*d*. Herein, a ratio between a depth (not shown) of the trench 140 to a thickness (not shown) of the substrate is between about 1:2 and 1:10, and a ratio between a depth (not shown) of the trench 120 to a thickness (not shown) of the substrate is between about 1:2 and 1:10. Therefore, the conductive lines 108 in the flexible electronic module 100 can be extended from the supporting portion 102*b* to the line-routing portion 102*d* through the connection portion 102*c* to form electrical connections between the electronic device 106 and external electronic devices or conductive lines (both not shown). Due to formation of the trenches 104, 140, and 120, the body portion 102*a*, and the line-routing portion 102*d*, such that while external stress (not shown) is applied to the flexible substrate 102 and causes tensile strain thereto, the tensile strain at the supporting portion 102*b* can be further reduced and maintains an amount of tensile strain less than 10%. The amount of tensile strain mentioned above is defined as [(a size of a portion prior to deformation−size of a portion after deformation)/a size of a portion before deformation]*100%.

Figure 12:
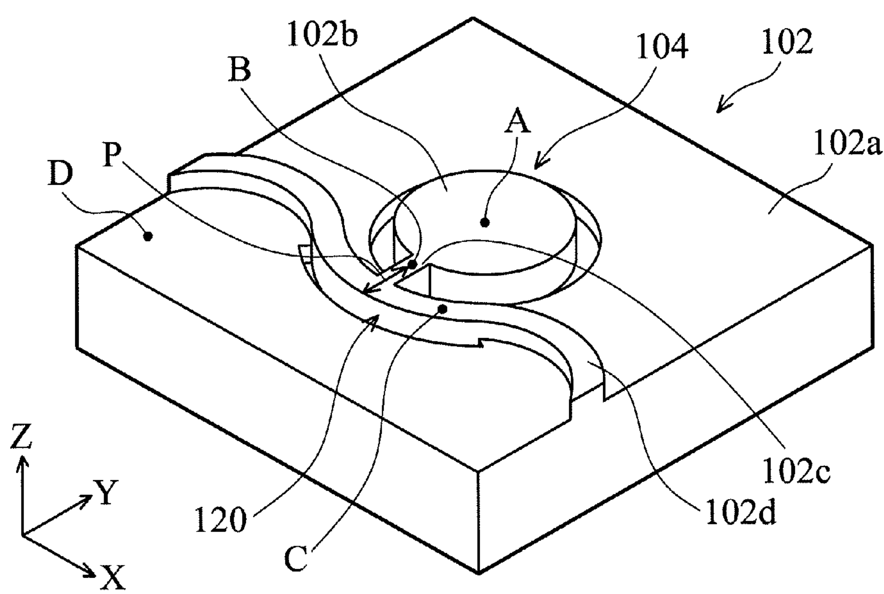
FIG. 12 is a schematic perspective view showing a flexible substrate applicable in a flexible electronic module according to yet another embodiment of the disclosure.

FIG. 12 is a schematic perspective view showing another exemplary flexible substrate 102 applicable in the flexible electronic module 100 shown in FIGS. 1-3. The exemplary flexible substrate 102 in FIG. 12 is similar with that shown in FIG. 8, and the body portion 102*a* shown in FIG. 12 is partially removed by, for example, a selective etching, to make surfaces of the supporting portion 102*b* and the connection portion 102*c* surrounded by the trench 104 above a surface of the body portion 102*a*. In addition, a portion of the body portion 102*a* connected with the connection portions 102*c* between the trenches 104 and 120 is also patterned by, for example, a selective etching to form a line-routing portion 102*d*, and ensure that a surface of the line-routing portion 102*d* is above a surface of the body portion 102*a* and is coplanar with surfaces of the supporting portion 102*b* and the connection portion 102*c*. As shown in FIG. 12, the connection portion 102*c* is connected to a portion of the supporting portion 102*b* and a portion of the line-routing portion 102*d*, and the line-routing portion 102*d* may face opposite sides of the connection portion 102*c* and extends over the body portion 102 in any shape. Therefore, the conductive lines 108 in the flexible electronic module 100 shown in FIGS. 1-3 may extend from the supporting portion 102*b* to the line-routing portion 102*d* through the connection portion 102*c*, thereby forming electrical connections between the electronic device 106 to external electronic devices or conductive lines (both not shown). In this embodiment, due to formation of the trenches 104 and 120, the body portion 102*a* and the line-routing portion 102*d*, such that while external stress (not shown) is applied to the flexible substrate 102 and causes tensile strain thereto, the tensile strain at the supporting portion 102*b* can be further reduced and maintains an amount of tensile strain less than 10%. The amount of tensile strain mentioned above is defined as [(a size of a portion prior to deformation−a size of a portion after deformation)/a size of a portion before deformation]*100%. A ratio of a height (not shown) of the line-routing portion 102*d* to a thickness (not shown) of the substrate is between about 1:50 and 1:1.

Figure 13:
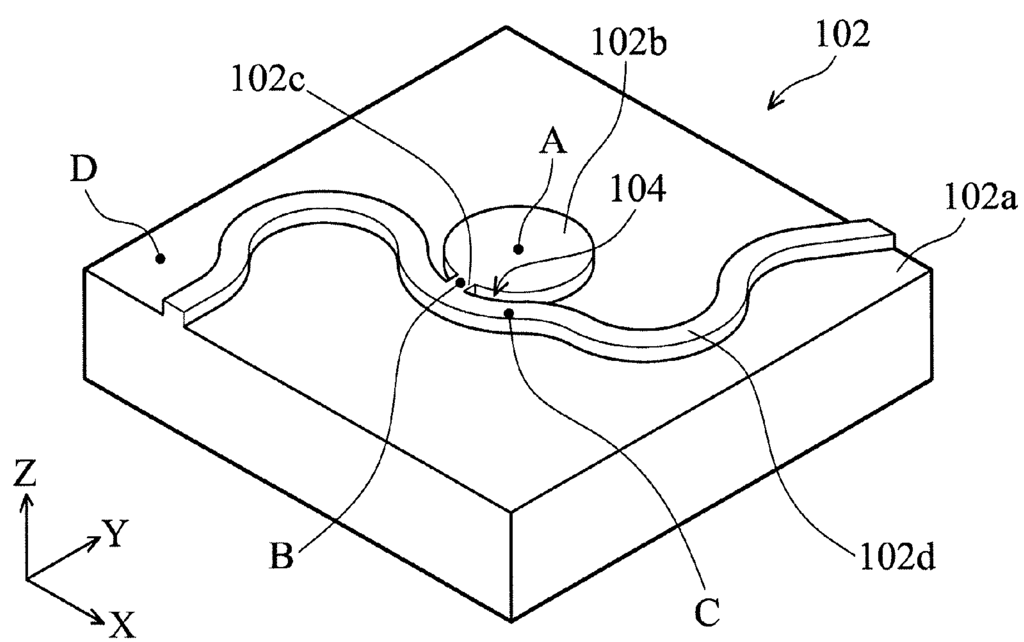
FIG. 13 is a schematic perspective view showing a flexible substrate applicable in a flexible electronic module according to another embodiment of the disclosure.

FIG. 13 is a schematic perspective view showing another exemplary flexible substrate 102 applicable in the flexible electronic module 100 shown in FIGS. 1-3. The exemplary flexible substrate 102 is similar with that shown in FIG. 4, and a line-routing portion 102*d* is further defined over the flexible substrate 102 due to formation of the trench 104, such that a surface of the body portion 102*a* of the flexible substrate 102 is lower than surfaces of the supporting portion 102*b*, the connection portion 102*c* and the line-routing portion 102*d*. The connection portion 102*c* is connected with a portion of the supporting portion 102*b* and a portion of the line-routing portion 102*d*, and a portion of the trench 104 is also formed in a portion between the supporting portion 102*b* and the line-routing portion 102*d* connected by the connection portion 102*c*. Therefore, the conductive lines 108 in the flexible electronic module 100 shown in FIGS. 1-3 may extend from the supporting portion 102*b* to the line-routing portion 102*d* through the connection portion 102*c* to form electrical connections between the electronic device 106 and external electronic devices or conductive lines (both not shown). Due to formation of the trench 104, the body portion 102*a* and the line-routing portion 102*d*, while external stress (not shown) is applied to the flexible substrate 102 and causes tensile strain thereto, the tensile strain at the supporting portion 102*b* can be further reduced. The amount of tensile strain mentioned above is defined as [(a size of a portion prior to deformation−a size of a portion after deformation)/a size of a portion before deformation]*100%.

In the embodiment shown in FIG. 13, a depth of the trench 104 is equal to a difference of heights between the supporting portion 102*b* and the body portion 102*a*, but is not limited thereto. The trench 104 may be further etched by a laser cutting to make the depth of the trench 104 greater than a height difference between the supporting portion 102*b* and the body portion 102*a*.

In the exemplary flexible substrates 102 applicable in the flexible electronic module 100 as shown in FIGS. 4-13, additional components such as the electronic device 106 and the conductive lines 108 (both not shown) can be further provided and disposed thereover for forming flexible electronic modules similar with the flexible electronic module 100 shown in FIGS. 1-3. Similar to that shown in FIGS. 1-3, the electronic device 106 can be disposed over the supporting-portion 102*b*, and the conductive lines 108 can be disposed over the supporting-portion 102*b*, the connection portion 102*c* and the body-portion 102*a* or the line-routing portion 102*d*.

Tensile Strain Test;

A software Autodesk® Inventor® 3D CAD is used to simulate a flexible substrate made of polydimethylsiloxane (PDMS) materials applied with a tensile stress of 1.2 N on both x and y directions thereto, and the flexible substrate has a size of 3 mm×3 mm×1 mm (length×width×height), and an amount of tensile strain at various points A, B, C, and D is measured. The amount of tensile strain mentioned above is defined as [(a size of a portion before deformation−a size of a portion after deformation)/a size of a portion before deformation]*100%. Characteristics of the flexible substrate in the disclosure are described in table 1 as follows.

TABLE 1

| Material of flexible substrate | polydimethylsiloxane (PDMS) | |
|---|---|---|
| General characteristics | Mass density | 1.03 g/cm$^3$ |
| | Subdue strength | 0.13 MPa |
| | ultimate anti-pull strength | 7.1 MPa |
| Stress characteristics | Young's modulus | 0.00075 GPa |
| | Poisson's ratio | 0.49 μl |
| | Shear modulus | 0.000251678 GPa |

Example 1

The flexible substrate 102 shown in FIG. 4 is provided to perform the tensile strain test described above. The trench 104 in the flexible substrate 102 has a width of 0.1 mm and a depth of 0.15 mm, and the supporting portion 102*b* has a circular shape of a radius of 0.5 mm from a top view. Simulation results of the amount of tensile strain at the various locations A, B, C and D over the body portion 102*a*, the supporting portion 102*b*, and the connection portion 102*c* shown in FIG. 4 are shown in table 2 as follows.

TABLE 2

| Location of Measurement | A | B | C | D |
|---|---|---|---|---|
| Amount of strain in X direction | 1% | 22% | 22% | 27% |
| Amount of strain in Y direction | 1% | 78% | 20% | 21% |

Example 2

The flexible substrate 102 shown in FIG. 8 is provided to perform the tensile strain test described above. The trenches 104 and 120 in the flexible substrate 102 have a width of 0.1 mm and a depth of 0.15 mm, respectively. The connection portion 102*c* and the trench 120 have a pitch P of 0.2 mm therebetween, and the supporting portion 102*b* has a circular shape of a radius of 0.5 mm from a top view. Simulation results of the amount of tensile strain at the various locations A, B, C and D over the body portion 102*a*, the supporting portion 102*b*, and the connection portion 102*c* shown in FIG. 8 are shown in table 3 as follows.

TABLE 3

| Location of Measurement | A | B | C | D |
|---|---|---|---|---|
| Amount of strain in X direction | 2% | 6% | 54% | 24% |
| Amount of strain in Y direction | 2% | 18% | 21% | 29% |

Example 3

The flexible substrate 102 shown in FIG. 11 is provided to perform the tensile strain test described above. The trenches 104 and 120 in the flexible substrate 102 have a width of 0.1 mm and a depth of 0.15 mm, respectively, the line-routing portion 102*d* has a width of 0.2 mm, and the supporting portion 102*b* has a circular shape of a radius of 0.5 mm from a top view. Simulation results of the amount of tensile strain at the various locations A, B, C and D over the body portion 102*a*, the supporting portion 102*b*, the connection portion 102*c*, and the line-routing portion 102*d* shown in FIG. 8 are shown in table 4 as follows.

TABLE 4

| Location of Measurement | A | B | C | D |
|---|---|---|---|---|
| Amount of strain in X direction | 1% | 15% | 22% | 30% |
| Amount of strain in Y direction | 4% | 34% | 7% | 30% |

Example 5

The flexible substrate 102 shown in FIG. 12 is provided to perform the tensile strain test described above. The trenches 104 and 120 in the flexible substrate 102 have a width of 0.1 mm and a depth of 0.15 mm, respectively, the line-routing portion 102*d* has a width of 0.2 mm and a height of 0.02 mm (related to a surface of the body portion 102*a*), the connection portion 102*c* and the trench 102 has a pitch P of 0.2 mm therebetween, and the supporting portion 102*b* has a circular shape of a radius of 0.5 mm from a top view. Simulation results of the amount of tensile strain at the various locations A, B, C and D over the body portion 102*a*, the supporting portion 102*b*, and the connection portion 102*c* shown in FIG. 12 are shown in table 5 as follows.

TABLE 5

| Location of Measurement | A | B | C | D |
|---|---|---|---|---|
| Amount of strain in X direction | 2% | 13% | 38% | 26% |
| Amount of strain in Y direction | 4% | 22% | 19% | 29% |

Example 5

The flexible substrate 102 shown in FIG. 13 is provided to perform the tensile strain test described above. The trench 104 between the supporting portion 102*b* and the line-routing portion 102*d* has a width of 0.1 mm and a depth of 0.15 mm, and the line-routing portion 102*d* has a width of 0.2 mm, and the supporting portion 102*b* has a circular shape of a radius of 0.5 mm from a top view. Simulation results of the amount of tensile strain at the various locations A, B, C and D over the body portion 102*a*, the supporting portion 102*b*, the connection portion 102*c*, and the line-routing portion 102*d* shown in FIG. 13 are shown in table 6 as follows.

TABLE 6

| Location of Measurement | A | B | C | D |
|---|---|---|---|---|
| Amount of strain in X direction | 3% | 6% | 14% | 31% |
| Amount of strain in Y direction | 3% | 25% | 39% | 31% |

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A flexible electronic module, comprising:

a flexible substrate comprising a supporting portion, a body portion, a connection portion, and a line-routing portion, wherein a surface of the body portion is lower than surfaces of the supporting portion, the connection portion, and the line-routing portion, and the supporting portion is connected with the line-routing portion through the connection portion;

a first trench disposed between the supporting portion, the connection portion, and the line-routing portion;

an electronic device disposed over the supporting portion; and a conductive line disposed over the supporting portion, the connection portion, and the line-routing portion for connecting the electronic device.

2. The flexible electronic module as claimed in claim 1, wherein the supporting portion has a circular, oval, or polygonal shape from a top view.

3. The flexible electronic module as claimed in claim 1, wherein an amount of tensile strain at the supporting portion is less than 10% while stress is applied to the flexible substrate and an amount of tensile strain of 20% to 60% at the body portion is achieved.

4. The flexible electronic module as claimed in claim 1, wherein the electronic device is a thermal-sensing device, a stress-sensing device, a light-sensing device, a humidity-sensing device, or a gas-sensing device, and the electronic device comprises silicon.

5. The flexible electronic module as claimed in claim 1, wherein the electronic device is a light-emitting device, a thermo-electrical device, or an electromagnetic device, and the electronic device comprises oxide or metal materials.

6. The flexible electronic module as claimed in claim 1, further comprising a second trench disposed in the body portion and being adjacent to the connection portion, wherein the second trench is connected with an end of the connection portion.

7. The flexible electronic module as claimed in claim 6, wherein a ratio of a depth of the first trench to a thickness of the flexible substrate is between 1:2 and 1:10, and a ratio of a depth of the second trench to the thickness of the flexible substrate is between 1:2 and 1:10.

8. The flexible electronic module as claimed in claim 6, wherein the line-routing portion is defined over a part of the body portion and being connected to the connection portion and adjacent to the second trench.

9. The flexible electronic module as claimed in claim 8, wherein a ratio of a depth of the first trench to a thickness of the flexible substrate is between 1:2 and 1:10, and a ratio of a depth of the second trench to the thickness of the flexible substrate is between 1:2 and 1:10, and a ratio of a height of the line-routing portion to the thickness of the flexible substrate is between 1:50 and 1:1.

10. The flexible electronic module as claimed in claim 1, wherein a ratio of a depth of the first trench to a thickness of the flexible substrate is between 1:2 and 1:10, and the first trench surrounds about 90% to 99% of a circumference of the supporting portion.

* * * * *